(12) United States Patent
Liu et al.

(10) Patent No.: US 7,065,696 B1
(45) Date of Patent: Jun. 20, 2006

(54) METHOD AND SYSTEM FOR PROVIDING HIGH-SPEED FORWARD ERROR CORRECTION FOR MULTI-STREAM DATA

(75) Inventors: Binfan Liu, Livermore, CA (US); Zhongqian Wang, San Jose, CA (US); Weimin Zhang, San Jose, CA (US)

(73) Assignee: BroadLogic Network Technologies Inc., San Jose, CA (US)

( * ) Notice: Subject to any disclaimer, the term of this patent is extended or adjusted under 35 U.S.C. 154(b) by 412 days.

(21) Appl. No.: 10/412,745

(22) Filed: Apr. 11, 2003

(51) Int. Cl.
*H03M 13/29* (2006.01)
(52) U.S. Cl. .................................... 714/755; 714/775
(58) Field of Classification Search ................ 714/755, 714/775
See application file for complete search history.

(56) References Cited

U.S. PATENT DOCUMENTS

| | | | | |
|---|---|---|---|---|
| 5,691,995 A | * | 11/1997 | Ikeda et al. | 714/786 |
| 5,771,239 A | * | 6/1998 | Moroney et al. | 370/474 |
| 5,896,405 A | * | 4/1999 | Moon | 714/795 |
| 5,970,386 A | * | 10/1999 | Williams | 725/69 |
| 6,181,714 B1 | * | 1/2001 | Isaksson et al. | 370/491 |
| 6,219,386 B1 | * | 4/2001 | Amrany et al. | 375/261 |
| 6,233,712 B1 | * | 5/2001 | Rhee et al. | 714/789 |
| 6,269,129 B1 | * | 7/2001 | Rhee et al. | 375/341 |
| 6,301,313 B1 | * | 10/2001 | Gevargiz et al. | 375/340 |
| 6,357,029 B1 | * | 3/2002 | Sinha et al. | 714/752 |
| 6,359,926 B1 | * | 3/2002 | Isaksson et al. | 375/219 |
| 6,359,938 B1 | * | 3/2002 | Keevill et al. | 375/316 |
| 6,480,477 B1 | * | 11/2002 | Treadaway et al. | 370/314 |
| 6,618,367 B1 | * | 9/2003 | Riazi et al. | 370/347 |
| 6,697,985 B1 | * | 2/2004 | Ilani | 714/751 |
| 6,763,025 B1 | * | 7/2004 | Leatherbury et al. | 370/395.64 |

* cited by examiner

*Primary Examiner*—Stephen M. Baker
(74) *Attorney, Agent, or Firm*—Townsend and Townsend and Crew LLP

(57) ABSTRACT

A system for providing a high-speed implementation for multi-stream forward error correction (FEC) is provided. According to one exemplary aspect, the system is able to provide block-based multi-stream FEC that reduces the power consumption when compared with conventional symbol-based FEC. The system provides a pipeline architecture for multi-stream FEC so that modules in the system are able to respectively process blocks of data from different channels or data streams.

23 Claims, 16 Drawing Sheets

METHOD AND SYSTEM FOR PROVIDING HIGH-SPEED FORWARD ERROR CORRECTION FOR MULTI-STREAM DATA

BACKGROUND OF THE INVENTION

The present invention relates generally to forward error correction and, more specifically, to a method and system for providing high-speed multi-channel forward error correction in a digital receiver.

Forward error correction (FEC) technology provides a method to detect and correct errors in transmitted data. As a result, this technology helps improve communication system performance. FIGS. 1A and 1B are simplified flow diagrams illustrating conventional implementations of an FEC circuit for an encoder and a decoder respectively. The conventional FEC circuit processes data symbol-by-symbol for one channel. This conventional FEC circuit, however, has a number shortcomings when it is applied to multiple channels. For example, one main problem with this conventional FEC circuit when applied to multiple channels is significant power consumption that is incurred when switching channels. If the FEC circuits are repeated to implement multi-channel designs, the excessive number of gates on an one-chip realization would be impracticable.

Another disadvantage of the foregoing conventional FEC circuit is that all the modules (blocks) in the FEC circuit collectively process one data stream at a time in a sequential manner. In other words, one data stream is processed after another sequentially. As a result, one or more modules in the FEC circuit may become idle thereby resulting in inefficient utilization of hardware resources.

The conventional FEC circuit, as shown above, receives a data stream that is made up of a continuous stream of fixed length packets. For the purpose of achieving packet delineation, synchronized bytes can be used; alternatively, syndromes that are computed over packets can be used. The use of syndromes improves packet delineation and synchronization for a receiver and provides error detection capability.

The syndrome s(x) is computed by passing one packet through a linear feedback shift register (LFSR) with the following filter characteristics:

$$h(x)=(1+x^n b(x))/g(x)$$

where n is the length of a packet in bit or symbol and "+" is an exclusive-OR (XOR).

FIG. 2 is a simplified block diagram illustrating a conventional LFSR syndrome generator. The receiver computes a sliding syndrome over the packets in the data stream. The potential starting point of the packets is identified if the computed syndrome is a valid code word. A locked alignment condition is established if various valid syndromes are at their respective expected locations. One conventional method is to compute a sliding syndrome over the preceding symbols that make up a potential packet when each bit or symbol is received. However, a high number of computations is needed to compute the syndromes which significantly reduce the data throughput. Another conventional method is to compute one bit or symbol for a syndrome when the bit or symbol is received. The computation is repeated until a potential packet is received. If the syndrome is not valid, another syndrome is computed for the next potential packet with a different starting point. This method requires $n^2$ symbols or n packets in the worst case to locate the starting point of a packet. As a result, the startup latency is quite long. Existing packet synchronization techniques have their shortcomings and disadvantages.

Another disadvantage of a conventional method that is used to generate syndromes is that multiple buffers are needed to store m*n symbols for potential packets when there are multiple channels, where m is the number of channels and n is the length of a packet.

Hence, it would be desirable to provide a method and system that is capable of achieving packet synchronization with two packets without consumption of substantial computation power and requiring minimal computing resources without regard to the number of channels.

BRIEF SUMMARY OF THE INVENTION

A method and system for providing a high-speed implementation for multi-stream forward error correction (FEC) is provided. According to one exemplary aspect, the system is able to provide block-based multi-stream FEC that reduces power consumption when compared with conventional symbol-based FEC. The system provides a pipeline architecture for multi-stream FEC so that modules in the system are able to respectively process blocks of data from different channels or data streams.

According to one exemplary embodiment, the system provides an implementation of a multi-stream decoder in the form of a trellis coded modulation (TCM) decoder that uses two fully parallel Viterbi convolutional decoders with self-synchronization for puncture boundaries. The parallel implementation can efficiently accomplish timing synchronization between I and Q channels for quadrature amplitude modulated (QAM) modulations. This exemplary implementation also allows the puncture boundaries of punctured convolutional codes in the Viterbi decoders to be synchronized with optimized computing resources.

According to one exemplary embodiment, the system provides an implementation that can synchronize FEC frames within as little as two frames.

According to another exemplary embodiment, the system uses an external SDRAM as both deinterleaving memory and a buffer for the immediately following processing block, such as a Reed-Solomon (RS) decoder. Optionally, the RS decoder has a pipeline, multi-block architecture.

According to yet another exemplary embodiment, the system is able to synchronize packets on serial data streams. The system generates sliding syndromes based on the preceding syndrome without passing the entire packet data through a linear feedback shift register. Each syndrome can be generated in a single clock cycle for high-speed implementation.

According to another exemplary embodiment, the system is able to synchronize packets on serial data streams in a multiple channel implementation. The system uses a buffer with the length equal to the packet length regardless of the number of channels.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

DETAILED DESCRIPTION OF THE INVENTION

Figure 1A:
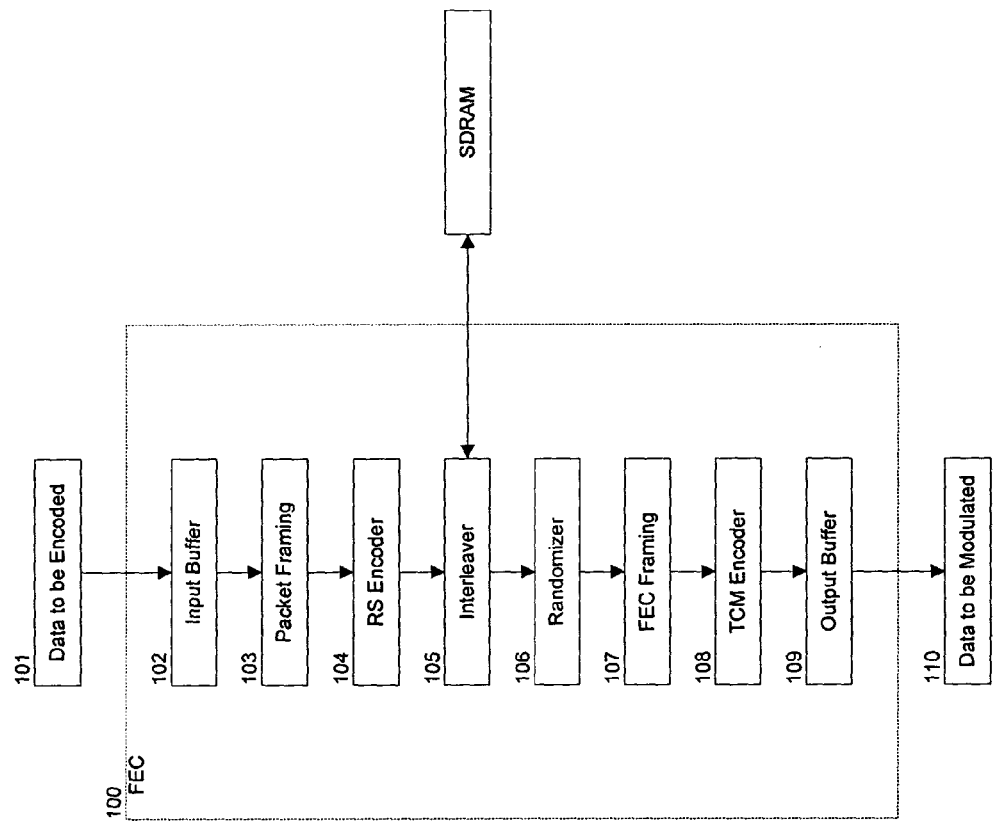
FIGS. 1A and 1B are simplified flow diagrams illustrating conventional FEC process flows for an encoder and a decoder respectively.
Figure 1B:
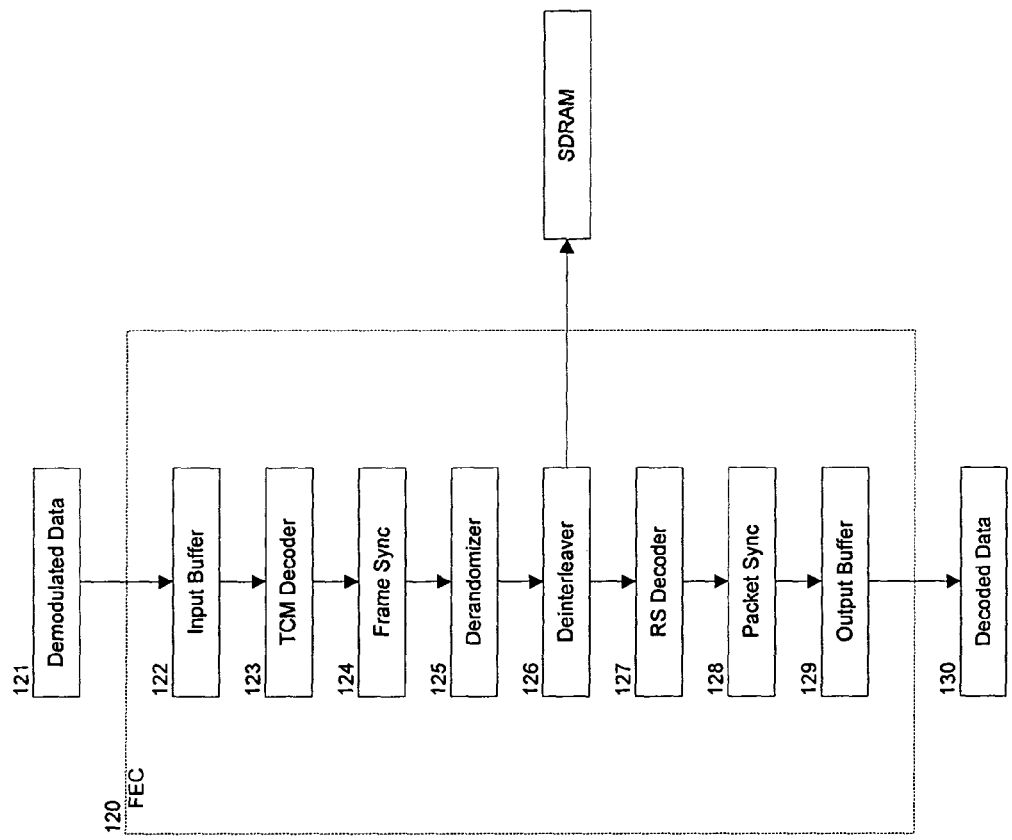

The present invention in the form of one or more exemplary embodiments will now be described. Packetized data are modulated into QAM symbols before they are transmitted by a transmitter. Each packet is made up of bits or symbols. An exemplary embodiment of the present invention is applied in the context of a decoding process as shown in FIG. 1B. It should be understood that while the present invention generally follows the steps shown in FIG. 1B, details and description provided herein with respect to implementations of these steps are deemed to be new and novel. The data to be demodulated in the form of QAM symbols are received as input and written into an input buffer. The input buffer is capable of receiving one or more data streams or channels. When a predetermined number of symbols for one channel are stored in the input buffer, such symbols, collectively a symbol block, are forwarded to the trellis coded modulation (TCM) decoder for processing. The predetermined number is an integer multiple of the number of possible puncture positions. It should be noted that, in an exemplary embodiment, each symbol in a symbol block has two constituent components, namely, an I-symbol (in-phase component) and a Q-symbol (quadrature component). For each I-symbol and Q-symbol, there is one (1) convolutionally encoded bit and the remaining bits are uncoded. Upon forwarding the predetermined number of symbols or the symbol block belonging to a channel to the TCM decoder for processing, the input buffer is switched to receive symbols from another channel until a symbol block is obtained for that channel.

When the TCM decoder receives the predetermined number of symbols or the symbol block for a channel, it starts to process the symbol block for that channel. The difference between the respective starting addresses of a read operation and a write operation of the input buffer is the puncture position of the TCM decoder. As will be further described below, the selection of the puncture position is performed by the TCM decoder. When the TCM decoder finishes decoding the symbol block, it outputs a decoded symbol block along with a corresponding stream channel identifier or ID to a frame synchronizer.

Figure 3:
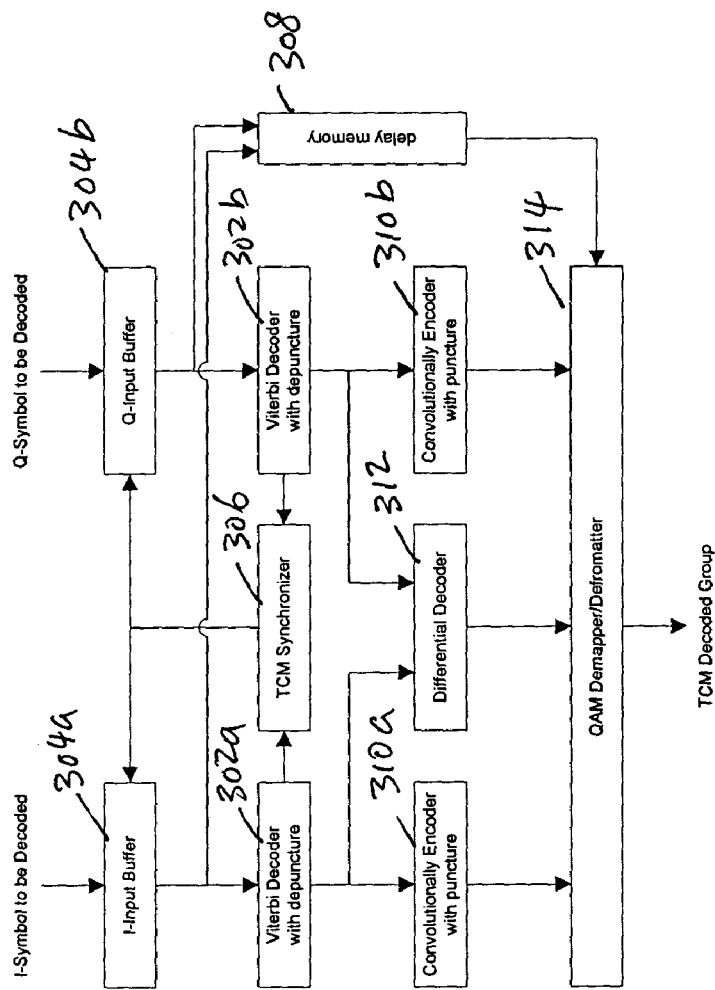
FIG. 3 is a simplified block diagram illustrating an exemplary embodiment of a trellis coded modulation decoder in accordance with the present invention.

FIG. 3 shows an exemplary embodiment of the TCM decoder in accordance with the present invention. This exemplary embodiment illustrates a parallel implementation of the TCM decoder 300 using two fully parallel Viterbi convolutional decoders 302a, 302b. The I-input buffer 304a and the Q-input buffer 304b respectively store I-symbols and Q-symbols received from the input buffer. As mentioned above, in one exemplary embodiment, one symbol block includes a predetermined number of symbols and each symbol is made up of an I-symbol and a Q-symbol.

Before the Viterbi decoders 302a, 302b perform their normal decoding process, the TCM synchronizer 306 determines the puncture position (input boundary) of the TCM decoder 300. The puncture position is determined as follows. There are two (2) error counters for each channel, one (1) for I-symbols and one (1) for Q-symbols. Both counters operate in a similar manner. The counter is incremented if the history path of the corresponding Viterbi decoder 302a or 302b at the end of the current symbol block does not originate from the minimum path at the end of the previous symbol block for that channel. The error count is accumulated for a predetermined number of symbol blocks for each of the possible puncture positions. The most likely puncture position (i.e., the smallest-error puncture position) is the one that corresponds to the smallest accumulated error count. If both I-symbols and Q-symbols identify the same puncture position corresponding to their smallest accumulated error counts, the TCM synchronizer 306 picks up that position and uses it for normal Viterbi decoding. If the I-symbols and the Q-symbols yield different smallest-error puncture positions, the TCM synchronizer 306 will repeat the process of determining the puncture position as described above.

When the I-symbols and the Q-symbols of a symbol block for a channel have been respectively stored in the I-input buffer 304a and the Q-input buffer 304b and the puncture position has been determined, the two Viterbi convolutional decoders 302a, 302b start to concurrently decode the respective convolutionally encoded bits of the I-input buffer 304a and the Q-input buffer 304b after depuncturing. The uncoded bits are stored in a delay memory 308. One Viterbi decoder 302a decodes the convolutionally encoded bit of the I-symbols and the other Viterbi decoder 302b decodes that of the Q-symbols. Hence, the two Viterbi decoders 302a, 302b can complete the decoding process in a concurrent manner.

Figure 4:
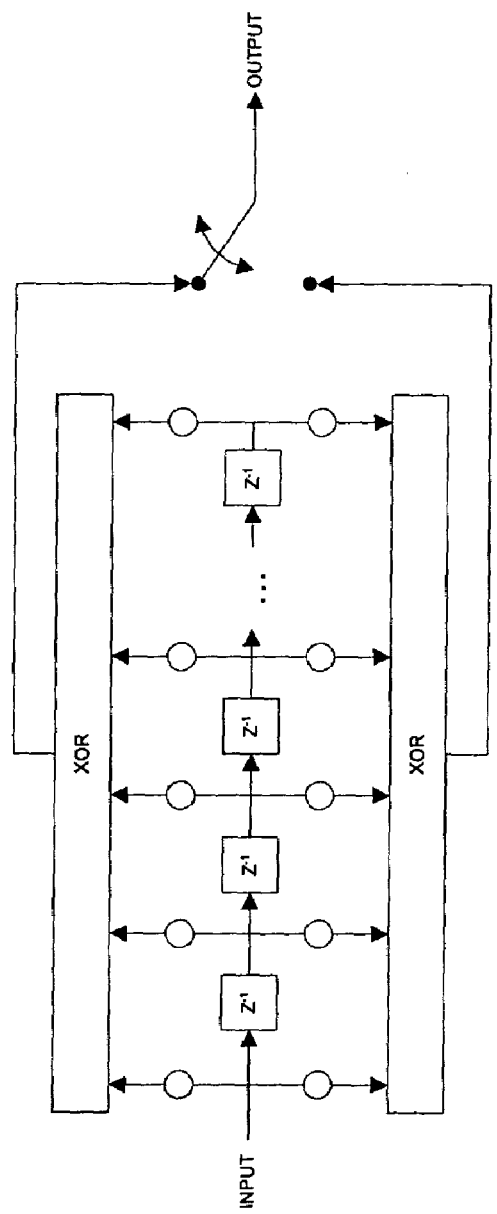
FIG. 4 is a simplified block diagram illustrating an exemplary embodiment of a convolutional encoder in accordance with the present invention.

Each I- and Q-pair from the two Viterbi decoders 302a, 302b corresponds to a specific four-point elemental constellation with QAM constellation. Once Viterbi decoding is completed, the decoded bits are fed to two convolutional encoders 310a, 310b with puncture in order to allow the encoders 310a, 310b to regenerate their outputs. The two encoders 310a, 310b also work in a concurrent manner. FIG. 4 shows an exemplary embodiment of the convolutional encoder 310a, 310b. The outputs of the encoders 310a, 310b and the uncoded bits in the delay memory 308 make up the complete QAM symbols within the symbol block for a channel. These QAM symbols are decoded in a QAM demapper 314. The QAM demapper 314 maps the received QAM symbols to their corresponding constellation bits.

The outputs from the two Viterbi decoders 302a, 302b are also differentially decoded by the differential decoder 312 to obtain a π/2 rotation-invariant QAM constellation. The differentially decoded bits and QAM demapped bits are provided to a deformatter 314 that maps them into a Reed-Solomon (RS) symbol stream. When one symbol block has been processed by the TCM decoder 300, a second symbol block from another channel can be loaded from the input buffer into the TCM decoder 300 for processing.

Figure 5:
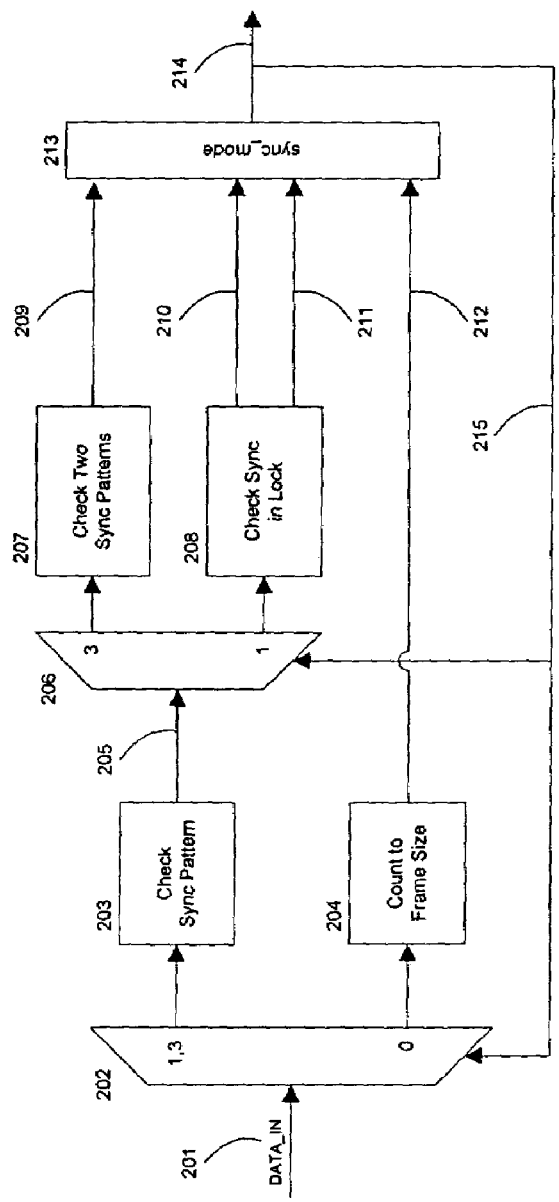
FIG. 5 is a simplified functional block diagram illustrating an exemplary embodiment of a frame synchronizer in accordance with the present invention.

The frame synchronizer is used to provide FEC frame synchronization. The frame synchronizer receives the TCM-decoded symbol block and the corresponding stream channel ID from the TCM decoder for processing. FIG. 5 is a simplified functional block diagram illustrating an exemplary embodiment of the frame synchronizer in accordance with the present invention. As shown in FIG. 5, the frame synchronizer 200 includes a number of components including a "check-sync-pattern" module 203, a "count-to-frame-size" module 204, a "check-two-sync-patterns" module 207, a "check-sync-in-lock" module 208 and a "sync-mode" module 213, each of which will be further described below.

An FEC frame normally includes a sync pattern or sequence that is either appended to the end of a fixed number of symbols or prefixed to the beginning of the symbols. The frame sync sequence contains a unique synchronization pattern plus information used by the FEC encoder at the transmitter, such as interleaving parameters. The unique synchronization pattern includes a fixed number of bits for each modulation scheme.

The frame synchronizer 200 searches for the sync pattern and determines the locations of the sync pattern in the symbol stream. By identifying the locations of the sync pattern, the frame boundary can be located (locked) and the embedded information can be extracted for additional processing. In an exemplary embodiment of the present invention, the frame synchronizer 200 detects two valid sync patterns separated by one data frame. Although false detections of sync patterns are possible, the probability of two false detections with one data frame apart is less than $10^{-16}$ if the frame sync pattern has at least twenty-eight (28) bits.

Referring to FIG. 5, the frame synchronizer 200 can engage in one of three modes: sync mode (mode "3"), check mode (mode "1") and data mode (mode "0") with initialization to mode "3" for each channel. When the frame synchronizer 200 receives a new symbol block and the corresponding channel ID, the mode corresponding to the channel ID is engaged. The data symbols from the symbol block are demultiplexed by a demultiplexer 202. In mode "1" and "3", the symbols are forwarded to the check-sync-pattern module 203. The output 205 of the check-sync-pattern 203 is a logical value "one (1)" if the frame synchronizer 200 just received a sync pattern and is otherwise a logic value "zero (0)". The output 205 from the check-sync-pattern module 203 is fed into a demultiplexer 206. If in mode "3", the output is forwarded to the check-two-sync-patterns module 207, and if in mode "1", the output is forwarded to the check-sync-in-lock module 208. Both modules 207 and 208 determine whether the mode needs to be changed for the channel. The mode is stored in a register 213 corresponding to the channel ID for the next symbol block of the channel. The mode is also output to a derandomizer.

When in mode "0", the received data symbols are forwarded to the count-to-frame-size module 204. The count-to-frame-size module 204 has a counter to count how many (payload) symbols have been received in a frame. When the counter is equal to the frame size, mode "0" is switched to mode "1" where the next data symbol to be received is the beginning of a sync pattern. The sync pattern is rechecked to determine whether frame boundaries are still locked in the check-sync-in-lock module 208.

Figure 6:
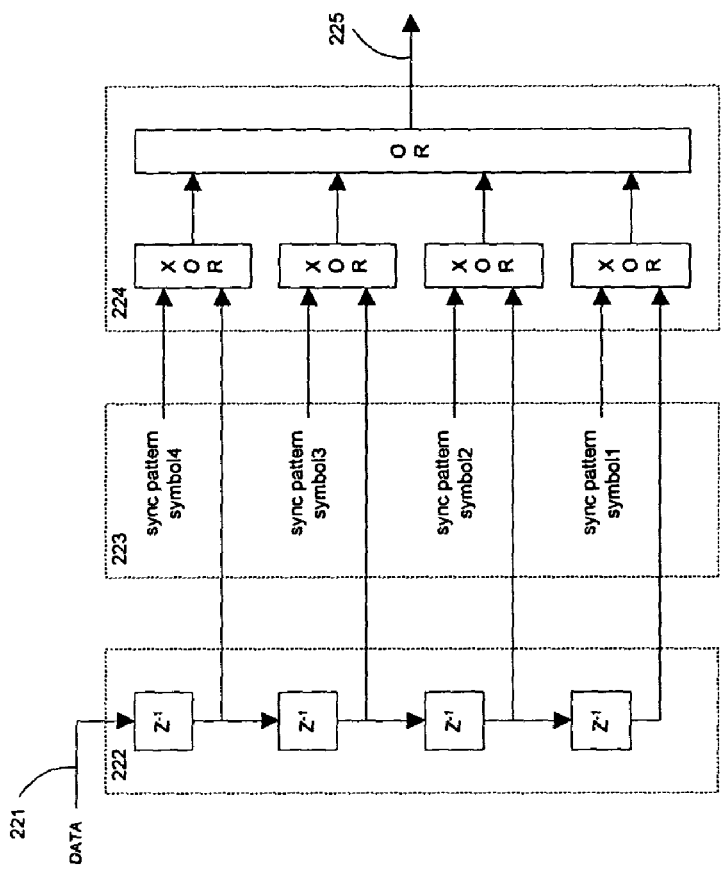
FIG. 6 is a simplified functional block diagram illustrating an exemplary embodiment of a "check-sync-pattern" module of the frame synchronizer in accordance with the present invention.

FIG. 6 is a simplified functional block diagram illustrating an exemplary embodiment of the check-sync-pattern module 203. The check-sync-pattern module 203 checks whether the received data symbols is the sync pattern. The sync pattern may be spread out over multiple symbols. When frames are not locked (i.e., when in mode "3"), the frame synchronizer 200 searches the location of the sync pattern in the data symbol stream for one channel. When frames are locked (i.e., when in mode "1"), the frame synchronizer 200 rechecks the sync pattern at the expected locations to ensure that the frames are still locked for the channel. The check-sync-pattern module 203 includes shift registers 222 for storing received data 221 that represent a potential sync pattern. The comparator 224 compares the contents of registers 222 to a desired sync pattern 223 that can be programmable. The check-sync-pattern module 203 has an output value 225 of a logic "one (1)" if the contents of the shift registers 222 match the desired sync pattern, and a logic "zero (0)" otherwise.

Figure 7:
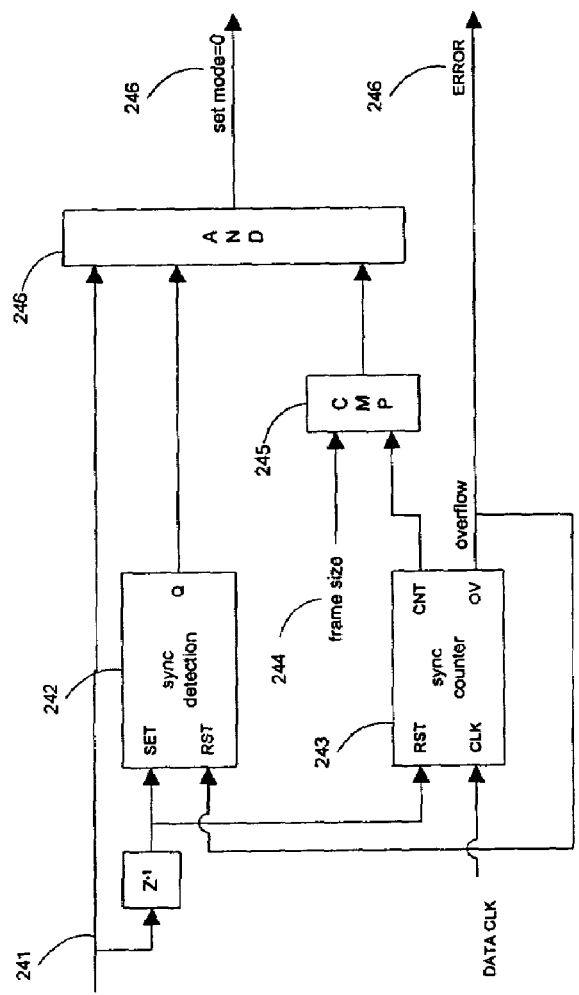
FIG. 7 is a simplified functional block diagram illustrating an exemplary embodiment of a "check-two-sync-patterns" module of the frame synchronizer in accordance with the present invention.

FIG. 7 is a simplified functional block diagram illustrating an exemplary embodiment of the check-two-sync-patterns module 207. The check-two-sync-patterns module 207 checks whether two (2) valid sync patterns are received and that they are separated by one data frame for one channel. As described above, the check-two-sync-patterns module 207 is engaged when mode "3" is active. The input 241 comes from the output of the check-sync-pattern module 203 that has a value of a logic "one (1)" if a sync pattern is identified. The sync-detection register 242 indicates whether at least one sync pattern for one channel is identified since the last reset. The sync-counter 243 counts the number of symbols between the two last identified sync patterns. The sync-counter 243 is reset when one sync pattern is identified and incremented for every data symbol for the channel until another sync pattern is identified. When another sync pattern is identified, the comparator 245 compares the current value of the sync-counter 243 to a predetermined frame size 244. The module 207 switches the mode from sync mode (mode "3") to data mode (mode "0") using an AND circuit 246 if all of the following conditions are met: the current input indicates that one sync pattern is identified; one or more sync patterns have been identified; and the value of the sync-counter 243 is equal to the predetermined frame size. The module 207 may generate an error signal 246 if the sync-counter 243 is greater than a predetermined threshold. The error signal 246 also resets the sync-detection register 242.

Figure 8:
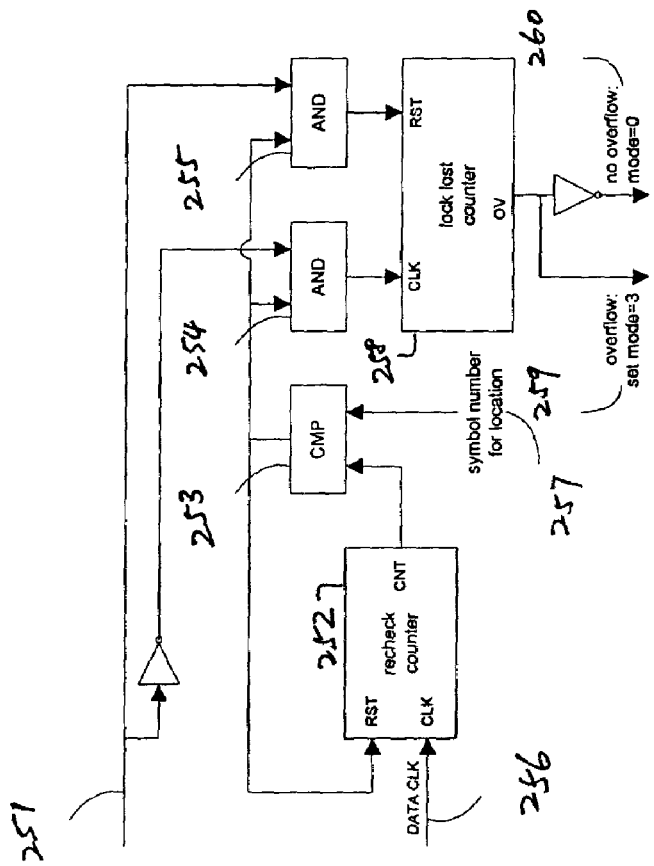
FIG. 8 is a simplified functional block diagram illustrating an exemplary embodiment of a "check-sync-in-lock" module of the frame synchronizer in accordance with the present invention.

FIG. 8 is a simplified functional block diagram illustrating an exemplary embodiment of the check-sync-in-lock module 208. The check-sync-in-lock module 208 checks whether one valid sync pattern is at the expected location in the symbol stream when the frame synchronizer 200 is in check mode (i.e., mode "1"). The module 208 is activated at the end of (payload) symbols where mode "0" is switched to mode "1", and is deactivated at the beginning of (payload) symbols where mode "1" is switched to mode "0" or at the start of a new search where mode "1" is switched to mode "3". The recheck counter 252 resets when the module 208 is activated. The recheck-counter 252 counts the number of symbols after the payload symbols for one channel to ensure the expected location for the sync pattern can be checked. The input 251 comes from the check-sync-pattern module 203. The input 251 is a logic "one (1)" if a sync pattern is received by the check-sync-pattern module 203. The comparator 253 gives an output of a logic "one (1)" at the moment that the recheck counter 252 is equal to a predetermined number of symbols for the expected location of the sync pattern so that the input 251 at the expected location can go through the two AND circuits 254, 255 to the lock-lost counter 258. At the expected location, the input 251 with a logic "one (1)" indicates that frame boundaries are still in locked and the lock-lost counter 258 is reset. On the other hand, the input 251 with a logic "zero (0)" indicates that the lock of frame boundaries may be lost and the lock-lost counter 258 is incremented by one (1). If the content of the lock-lost counter 258 for one channel is less than a predetermined threshold, the mode is switched from check mode (i.e., mode "1") to data mode (i.e., mode "0") such that incoming payload symbols can be continually received and forwarded to the module following the frame synchronizer 200. If the content of the lock-lost counter 258 is greater than the predetermined threshold, that indicates frame boundaries have been lost. As a result, the mode corresponding to the channel is switched from check mode (i.e., mode "1") to sync mode (i.e., mode "3") such that synchronization restarts for that channel. Because transmission errors may occur in sync pattern symbols, the lock-lost counter 258 can increase the reliability of the frame synchronization and in turn the FEC reliability.

The frame synchronizer starts outputting the TCM-decoded symbols along with the corresponding stream channel ID to a derandomizer once the frame synchronizer locks the frame boundaries in the symbol stream and enters the data mode. When in the data mode, the frame synchronizer forwards its input to its output. The frame synchronizer also outputs a sync signal for that channel at every beginning of the payload symbols where mode "1" or "3" is switched to mode "0". The information embedded in the sync signal is also output to other modules.

The derandomizer processes the symbols received from the frame synchronizer and outputs derandomized symbols to a deinterleaver. The derandomized symbols are interleaved RS symbols. The randomizer at the transmitter provides for even distribution of the symbols by removing unequal excitation to its modulator. The derandomizer performs the same process on the received symbols to recover the original data symbols. In one exemplary embodiment, the derandomizer uses a linear feedback shift register specified by a polynomial $$f(x) = \alpha^{n_0} + \alpha^{n_1}x + \ldots + \alpha^{n_m}x^m$$

over a finite field, where $\alpha$ is a primitive element in the field. The multiplication operations $\alpha^{n_i}x$ are performed by simple XORing of appropriate bits of x. A person of ordinary skill in the art will know and appreciate how to realize a derandomizer using a linear feedback shift register.

The deinterleaver then, in turn, combines the derandomized symbols to form derandomized words and stores them into its holding buffer based on the stream channel ID. Each derandomized word includes a number of derandomized symbols such that the word length matches the data width of a deinterleaving memory. Use of memory data width greater than the symbol size of a derandomized symbol can reduce the speed of memory or increase data throughput for high-speed operation. The holding buffer allows access to the deinterleaving memory to be block-based and burst-operated without engaging in excessive channel switching and overhead command operation cycles.

Figure 9:
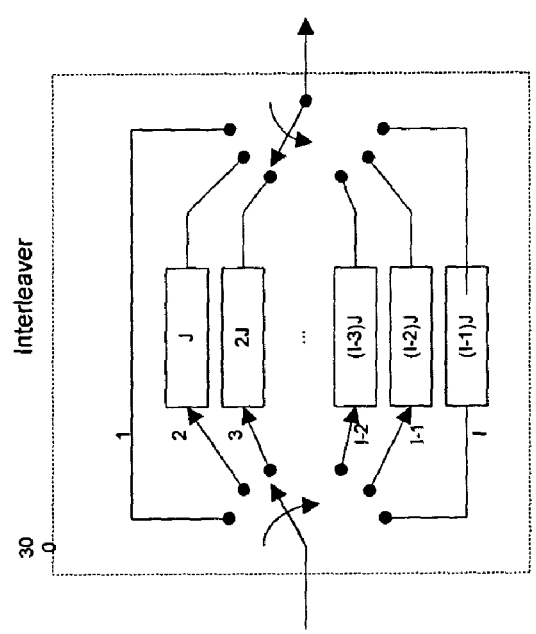
FIG. 9 is a simplified functional block diagram illustrating an interleaver.
Figure 10:
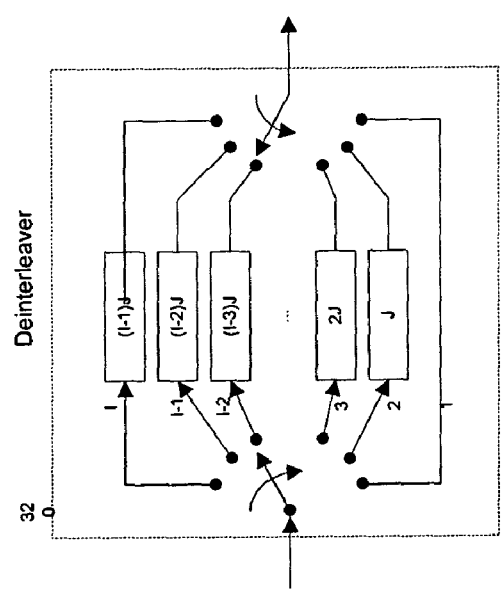
FIG. 10 is a simplified functional block diagram illustrating a deinterleaver.

FIGS. 9 and 10 are simplified functional block diagrams illustrating an interleaver and a deinterleaver, respectively. Coded RS symbols at the transmitter are interleaved by an interleaver before transmission. As a result, the sequence of symbols is changed after interleaving. A deinterleaver is used after reception to recover the symbols in the original sequence. Burst errors in the RS symbols during transmission are spread out over multiple RS blocks after deinterleaving. Such spreading of burst errors improves the decoding performance of a RS decoder (to be further described below) in a burst noisy environment. Both interleaver and deinterleaver generally require a memory to buffer the RS symbols. In one exemplary embodiment, the memory that is used to buffer the RS symbols is a synchronous dynamic random access memory (SDRAM). The symbols are written to the SDRAM in one sequence and read in another sequence. There is a delay or latency for each channel between the first written symbol and the first read symbol. The latency depends on the interleaving parameters, depth (I) and increment (J) shown in FIGS. 9 and 10. Each of these parameters is a predetermined number of symbols for a corresponding channel. In one exemplary implementation, these parameters are extracted from the symbol stream by the frame synchronizer.

Figure 11:
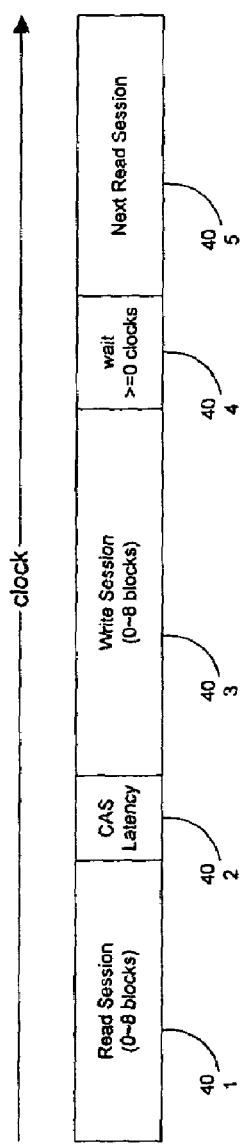
FIG. 11 is a simplified timing diagram illustrating the timing of read and write sessions of an exemplary embodiment of a SDRAM in accordance with the present invention.

In one exemplary embodiment, an SDRAM controller divides SDRAM access into two sessions: a read session and a write session, as shown in FIG. 11. There is a column address strobe (CAS) latency of the SDRAM between read and write sessions. The derandomized words stored in the holding buffer are grouped into write blocks. Each write block has a predetermined number of derandomized words. In an exemplary implementation, the predetermined number is sixteen (16) words. When the holding buffer of the deinterleaver is filled with at least one write block for one channel, the deinterleaver marks that channel. As will be further described below, this marking of the channel allows an SDRAM controller to write the words into an SDRAM in the next available write session.

Figure 12:
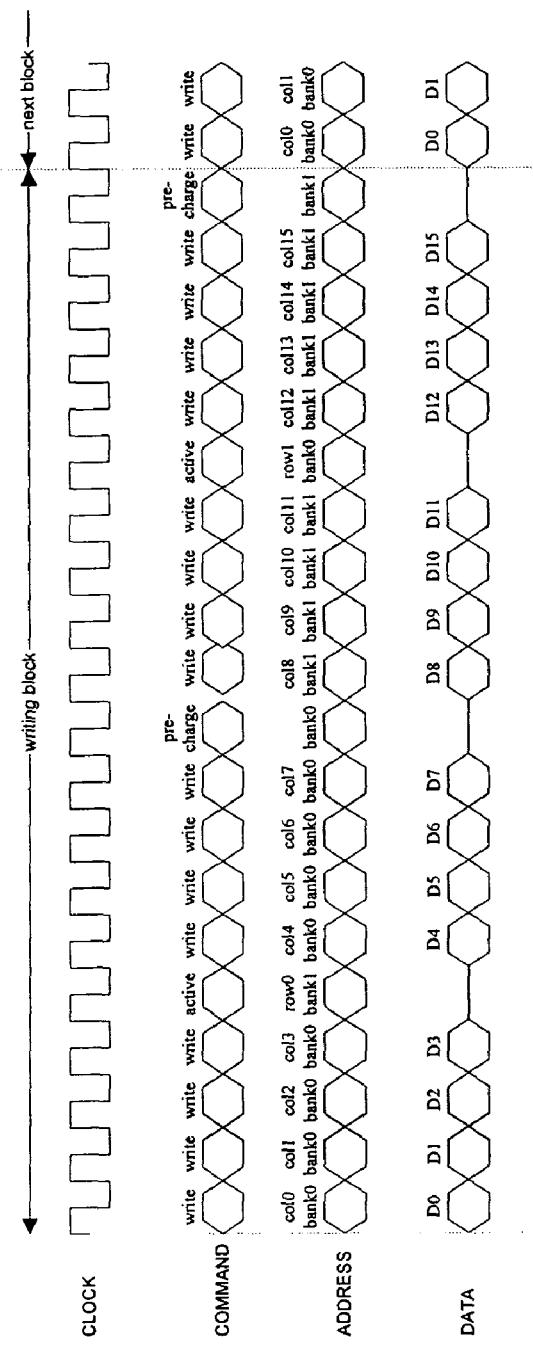
FIG. 12 is a timing diagram illustrating an SDRAM write block in accordance with an exemplary embodiment of the present invention.

FIG. 12 is a timing diagram illustrating an SDRAM write session. The "precharge" commands can be hidden in the immediately preceding "write" commands. During each write session, a number of write blocks from the holding buffer can be written to the SDRAM. For each write session, the number of write blocks that can be written can range from zero (0) to a predetermined number. In an exemplary implementation, the predetermined number is eight (8) write blocks. Write blocks belonging to different channels can be written to the SDRAM in one write session. The write blocks are written into the SDRAM in a chronological order based on when the write blocks are marked. In one exemplary implementation, the first half of one write block is written into one row in one bank of the SDRAM and the second half of that same write block is written into another row in another bank. The foregoing process is then repeated until the predetermined number of write blocks have been written into the SDRAM. The use of the foregoing technique helps reduce SDRAM overhead command cycles.

There are counters counting the number of write blocks that have been written for each channel. When the SDRAM is filled with at least a predetermined number of words for one channel, the deinterleaver marks that channel. The predetermined number is an integer multiple of the length of a processing block for the following component, Reed-Solomon (RS) decoder. In an exemplary embodiment, the processing block in the RS decoder is an RS block. As will be further described below, the marking of the channel allows the SDRAM controller to read words from the SDRAM in the next available read session after startup latency. The data of the marked channel are buffered in the SDRAM and read in a chronological order when the RS decoder completes processing the RS blocks read in the last read session. As a result, multiple buffers are not required in the RS decoder.

Figure 13:
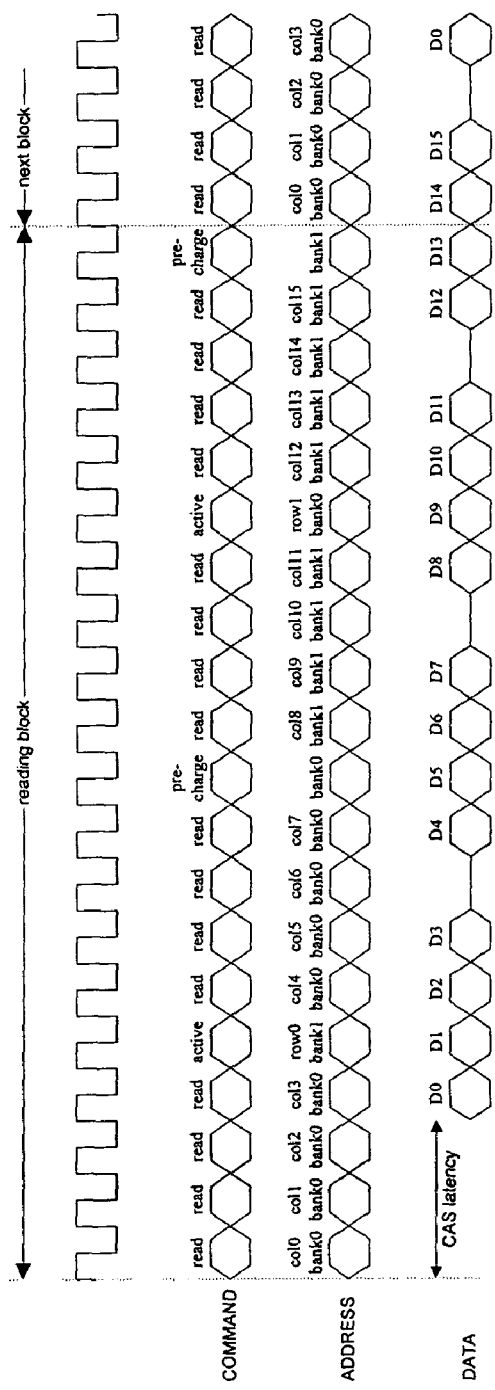
FIG. 13 is a timing diagram illustrating an SDRAM read block in accordance with an exemplary embodiment of the present invention.

FIG. 13 is a timing diagram illustrating an SDRAM read session. The "precharge" commands can be hidden in the immediately preceding "read" commands. During each read session, a number of RS symbols from the SDRAM can be read such that the total number of symbols is an integer multiple of the number of symbols in an RS block for one channel. Each read session divides words to be read from the SDRAM into read blocks. For each read session, the number of read blocks that can be read can range from zero (0) to a predetermined number. The predetermined number is based on the number of RS symbols to be read for one read session. It should be remembered that a word combines fixed multiple RS symbols when it is written into the SDRAM. In an exemplary implementation, the predetermined number is eight (8) read blocks. Each read block includes a predetermined number of words. One read block includes words read from one row in one bank of the SDRAM and other words read from another row in another bank of the SDRAM. The read block is then stored in a reorder buffer. Words for the next read block are then read from two different rows in two different banks in the SDRAM. Similarly, the next read block is also stored in the reorder buffer. The foregoing process is then repeated until the predetermined number of read blocks have been read during a read session. The use of the foregoing technique helps reduce SDRAM overhead command cycles and increase data throughput. The words from the read blocks in the reorder buffer are separated into RS symbols and are then reordered into their original order and output to the RS decoder.

The Reed-Solomon (RS) decoder then processes the blocks read from the SDRAM. Note that after one SDRAM read session, the data of one or more RS blocks are input to the RS decoder. For each RS block, the RS decoder corrects up to a fixed number of symbol errors which occurred during transmission. One RS block includes a fixed number of symbols depending on the coding scheme. In an exemplary embodiment, the RS decoder includes a syndrome block, an error location block, and an error magnitude and correction block. Each of these blocks is RS-block based. There is a channel ID for the block being processed. These blocks may process different RS blocks belonging to different channels at any given time.

Figure 2:
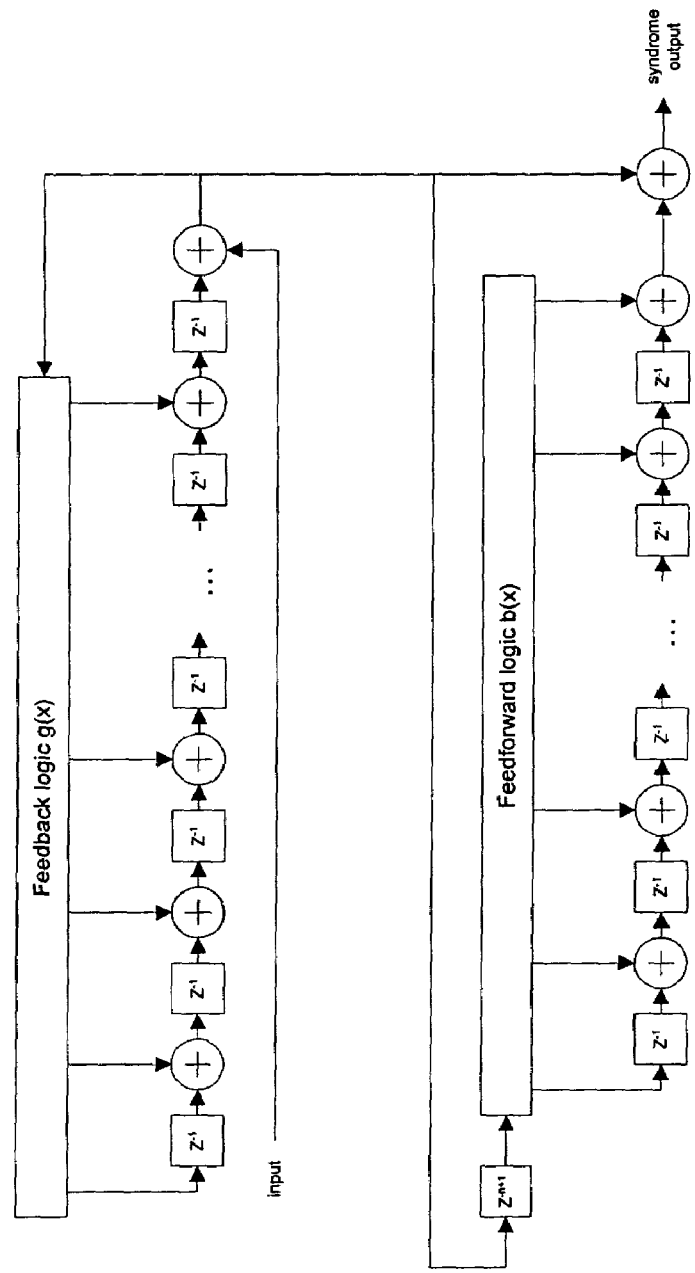
FIG. 2 is a simplified block diagram illustrating a conventional LFSR syndrome generator.

Output from the Reed-Solomon decoder is then forwarded to a packet synchronization circuit. At the transmitter, the FEC encoder converts input data stream to a continuous stream of packets in its packet-framing module. A packet is made up of a fixed number of bytes and one checksum (syndrome) byte. The checksum is computed by passing one packet through a linear feedback shift register (LFSR) $g(x)$ with the initialization of a fixed value. The checksum is appended to the packet contents. As shown in FIG. 2, the equation of the LFSR $h(x)=(1+x^{n-1}b(x))/g(x)$ is equivalent to $h(x)=s(n-1)+s(0)b(x) \mod g(x)$ where $s(n-1)$ is the state of the LFSR at the last content byte of one packet and $s(0)$ is the state at the first content byte. Therefore, the checksum is $s(n-1)$ XORing $s(0)b(x) \mod g(x)$. The byte stream is converted to an RS-symbol stream and then fed to the RS encoder.

Figure 14:
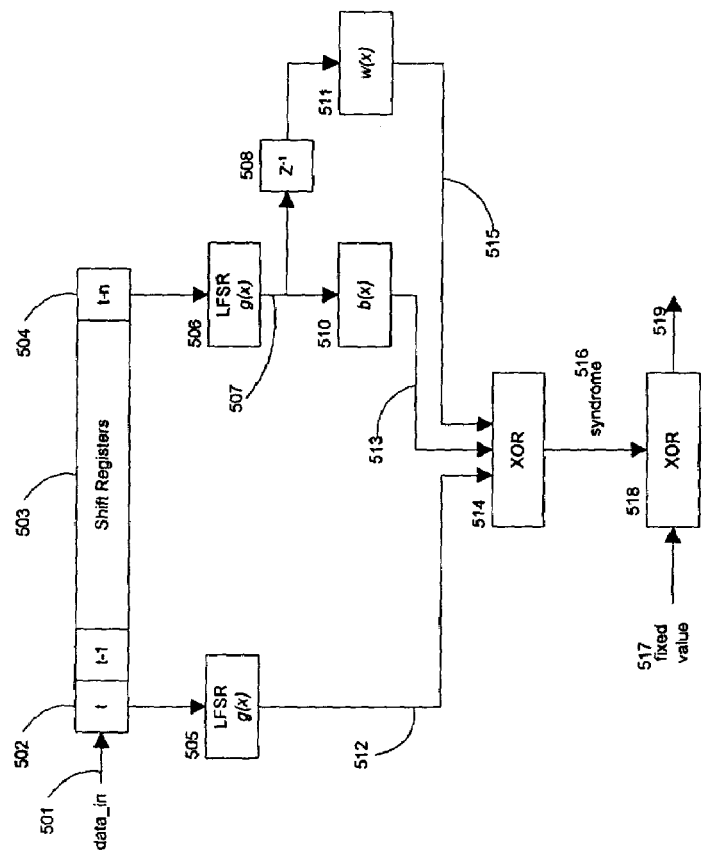
FIG. 14 is a simplified functional block diagram illustrating an exemplary embodiment of a packet synchronization circuit in accordance with the present invention.

At the receiver, the RS-decoded symbol stream is first converted to a byte stream before the byte stream is provided to the packet synchronization circuit. FIG. 14 is a simplified functional block diagram illustrating an exemplary embodiment of the packet synchronization circuit. The packet synchronization circuit is used to search valid syndromes (checksums) in the byte stream for one channel so that the packet boundaries can be determined. The valid syndrome is a fixed value for each packet. However, due to lack of information about packet boundaries at the beginning of the byte stream for one channel, sliding syndromes are computed by passing a data symbol stream through the same LFSR $g(x)$ without the initialization. The present invention removes the effect of syndrome by the initial value in order to obtain correct syndromes. The obtained sliding syndromes are compared to the fixed value to determine the packet boundaries. Referring to FIG. 14, in an exemplary embodiment, there are shift registers 503. The length of the shift registers 503 is equal to the packet length. The data of the shift register 502 at one end is input to an LFSR 505 to generate the current state $s(n-1)$. The data of the shift register 504 at the other end is input to the another LFSR 506 to generate the state $s(0)$ of n bytes later. Hence, the state $s(0)$ is a delay version of the state $s(n-1)$. The operation $s(0)b(x) \mod g(x)$ is performed by XORing the appropriate bits of $s(0)$. The effect of the initial values is that the state $s(0)$ is delayed by one and $w(x)$ is achieved, where $w(x)$ is the zero-input response of $h(x)$ with the initial value $s(0)$. Again, the operation $s(0)w(x) \mod g(x)$ is performed by XORing of appropriate bits of $s(0)$. XORing the outputs of 512, 513 and 515 gives the syndrome. A person of ordinary skill in the art will know and appreciate how to realize the multiplication and modulus operations.

The obtained syndromes are compared to the fixed value 517. Packets are synchronized if three valid syndromes for one channel are found, each separated by one packet. The module switches to data mode for the channel and starts to output the byte stream to other parts of the system.

In an exemplary embodiment, the shift registers 503 are shared for all channels in multiple channel implementations to significantly reduce the memory size requirement. At the beginning, one channel is initialized to sync mode and undergoes packet synchronization as described above. In the meantime, all other channels are in wait mode. One of the waiting channels switches to sync mode when the previously synchronizing channel is switched to data mode or when the previously synchronizing channel is switched back to the wait mode due to timeout. The operations are performed until all the channels are in data mode.

In the data mode, because the packet boundaries for one channel are known, the syndromes can be calculated without the shift registers 503. A channel may switch back to wait mode if there is a predetermined number of invalid syndromes for the channel. The packet synchronization circuit also outputs a sync signal to other parts of the system at the beginning of each packet.

The output from the packet synchronization packet is then forwarded to an output buffer. Contents from the output buffer are then delivered to other parts of the system.

Figure 15:
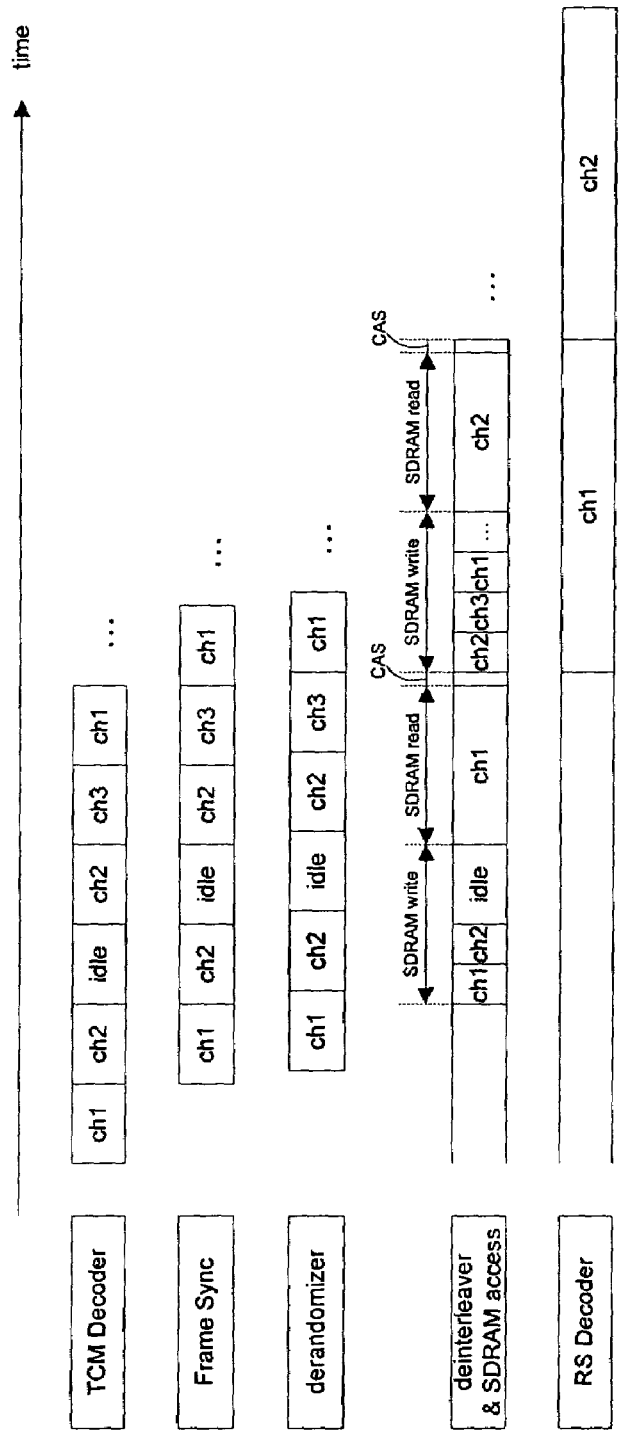
FIG. 15 is a simplified timing diagram illustrating the respective contents of the various components of the system during an illustrative processing sequence in accordance with the present invention.

The respective contents of the various components of the system are illustrated in a timing diagram as shown in FIG. 15. As shown in FIG. 15, the illustrated components are able to process data from multiple channels in a pipelined manner. Components of the system do not have to all process data from a single channel at any one time. That is, components can respectively process data from different channels at the same time. The components may process different symbols during different time durations. In an exemplary embodiment, the total number of symbols in one SDRAM read session can be equal to the total number of symbols in one SDRAM write session. For one channel, the number of the symbols in one read session may be greater than that in one write session in multi-stream implementation. As a result, the processing time for an SDRAM read for one channel is longer than the processing time for an SDRAM write in the deinterleaver. When the preceding component finishes the processing of a symbol block for one channel, such component delivers the processed data along with the corresponding channel ID to the following component. Hence, the following component knows which channel of data to be processed and it can load the states that were last processed for that channel.

In an exemplary embodiment illustrated in FIG. 15, when the TCM decoder finishes decoding a symbol block for a first channel, it outputs the TCM decoded symbol block along with a corresponding channel ID to the following component, the frame synchronizer. The TCM decoder then decodes a symbol block for a second channel while the frame synchronizer processes the TCM-decoded symbol block for the first channel. The frame synchronizer starts outputting the TCM-decoded symbol block along with the corresponding channel ID to the following component, the derandomizer. When the derandomizer received the symbols of TCM-decoded symbol block for the first channel from the frame synchronizer, it starts to derandomize the symbols and outputs the derandomized symbol block to a deinterleaver. As described above, the deinterleaver writes the derandomized symbols to the SDRAM in its write session and counts the number of symbols written. When at least one or more Reed-Solomon (RS) blocks for the first channel are in the SDRAM after the startup latency, the deinterleaver reads these RS blocks from the SDRAM in a read session and outputs them to the RS decoder to decode these blocks. While the RS decoder is decoding the RS blocks for the first channel, the deinterleaver performs a write session and/or a read session for other channels.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A system for providing forward error correction, comprising:
    an input buffer configured to receive and store a plurality of symbols from a plurality of channels, wherein upon storing a symbol block belonging to a channel, the input buffer outputs the symbol block, the symbol block being made up of a predetermined number of symbols, wherein upon outputting the symbol block, the input buffer begins to receive and store another symbol block associated with another channel;
    a first decoder configured to receive and process one symbol block belonging to one of the plurality of channels and generate an output, the output including a decoded symbol block and a corresponding channel identifier, wherein upon generating the output, the first decoder receives a next symbol block from the input buffer for processing, the next symbol block associated with one of the plurality of channels;
    a frame synchronizer configured to receive the output from the first decoder, perform frame synchronization on the decoded symbol block, and generate an output, the output including the decoded symbol block and the corresponding channel identifier and frame information used to identify locations of frame boundaries in the decoded symbol block;
    a derandomizer configured to receive the output from the frame synchronizer, derandomize the decoded symbol block and generate an output, the output including a derandomized symbol block and a corresponding channel identifier;
    a deinterleaver having a memory, the deinterleaver configured to receive the output from the derandomizer, combine derandomized symbols in the derandomized symbol block to form a plurality of derandomized words, form one or more write blocks each having a predetermined number of derandomized words, store the one or more write blocks into the memory based on the corresponding channel identifier of the derandomized symbol block during a write session, and read one or more read blocks from the memory based on a specified channel identifier during one or more read sessions;
    a second decoder configured to receive the one or more read blocks, correct any symbol errors therein, and generate an output, the output including one or more decoded blocks; and
    a packet synchronization circuit configured to receive the one or more decoded blocks and perform packet synchronization on the decoded blocks to identify packet boundaries within the one or more decoded blocks;
    wherein the input buffer, the first decoder, the frame synchronizer, the derandomizer, the deinterleaver, the second decoder and the packet synchronization circuit are able to respectively process data corresponding to the plurality of channels in a concurrent manner.

2. The system of claim 1 wherein:
    each symbol is a quadrature amplitude modulated (QAM) symbol having an I-component and a Q-component; and
    the predetermined number of symbols is an integer multiple of a plurality of puncture positions.

3. The system of claim 1 wherein each of the plurality of derandomized words has a word length that matches a data width of the memory.

4. The system of claim 1 wherein the memory of the deinterleaver is a synchronous dynamic random access memory.

5. The system of claim 1 wherein:
    the second decoder is a Reed-Solomon (RS) decoder; and
    the one or more read blocks make up one or more RS blocks.

6. The system of claim 1 wherein the packet synchronization circuit is capable of operating in one of a plurality of operating modes including a first mode, a second mode and a third mode.

7. The system of claim 1 wherein the first decoder is a trellis coded modulation (TCM) decoder.

8. The system of claim 7 wherein:
each symbol is a quadrature amplitude modulated (QAM) symbol having an I-component and a Q-component, and
the TCM decoder includes first and second Viterbi convolutional decoders operating in a parallel manner, the first and second Viterbi convolutional decoders respectively receiving the I-component and the Q-component.

9. The system of claim 8 wherein:
the TCM decoder further includes a trellis coded modulation (TCM) synchronizer configured to identify a puncture position using the corresponding I-components and Q-components from the symbol block being processed by the first decoder; and
the TCM synchronizer provides the puncture position to the first and second Viterbi convolutional decoders for Viterbi decoding.

10. The system of claim 1 wherein:
the frame synchronizer is capable of operating in one of a plurality of operating modes including a first mode, a second mode and a third mode; and
the frame synchronizer selects the appropriate mode to process the decoded symbol block from the first decoder based on the corresponding channel identifier.

11. The system of claim 10 wherein:
when engaged in the first mode, the frame synchronizer identifies locations of frame boundaries in the decoded symbol block;
when engaged in the second mode, the frame synchronizer confirms the identified locations of frame boundaries in the decoded symbol block; and
when engaged in the third mode, the frame synchronizer outputs the decoded symbol block.

12. The system of claim 10 wherein:
upon completion of processing of the decoded symbol block, the frame synchronizer stores the frame information and mode information, the mode information being associated with the channel identifier corresponding to the decoded symbol block and indicating the operating mode that is last used to process the decoded symbol block; and
upon receiving a next channel identifier, the frame synchronizer selects an appropriate operating mode based on the mode information.

13. The system of claim 12 wherein the appropriate operating mode is selected as follows: if the next channel identifier is the same as a previously stored channel identifier, the operating mode associated with the previously stored channel identifier is engaged by the frame synchronizer to process the decoded symbol block associated with the next channel identifier.

14. A system for providing forward error correction, comprising:
an input buffer configured to receive and store a plurality of symbols from a plurality of channels, wherein upon storing a symbol block belonging to a channel, the input buffer outputs the symbol block, the symbol block being made up of a predetermined number of symbols, wherein upon outputting the symbol block, the input buffer begins to receive and store another symbol block associated with another channel;

a trellis coded modulated (TCM) decoder configured to receive and process one symbol block belonging to one of the plurality of channels and generate an output including a TCM-decoded symbol block and a corresponding channel identifier, wherein upon generating the output, the TCM decoder receives a next symbol block from the input buffer for processing, the next symbol block associated with one of the plurality of channels;

a frame synchronizer configured to receive one TCM-decoded symbol and its corresponding channel identifier from the TCM decoder, perform frame synchronization on the received TCM-decoded symbol block, and generate an output including the received TCM-decoded symbol block and its corresponding channel identifier and frame information used to identify locations of frame boundaries in the received TCM-decoded symbol block, wherein upon generating the output, the frame synchronizer receives a next TCM-decoded symbol block and its corresponding channel identifier from the TCM decoder for processing, and wherein the corresponding channel identifier of the next TCM-decoded symbol block from the TCM decoder is associated with one of the plurality of channels;

a derandomizer configured to receive one TCM-decoded symbol block from the frame synchronizer, derandomize the received TCM-decoded symbol block and generate an output including a derandomized symbol block and its corresponding channel identifier, wherein upon generating the output, the derandomizer receives a next TCM-decoded symbol block from the frame synchronizer, and wherein the next TCM-decoded symbol block from the frame synchronizer is associated with one of the plurality of channels;

a deinterleaver having a synchronous dynamic random access memory (SDRAM), the deinterleaver configured to receive one derandomizer symbol block and its corresponding channel identifier from the derandomizer, combine derandomized symbols in the received derandomized symbol block to form a plurality of derandomized words, form one or more write blocks each having a predetermined number of derandomized words, store the one or more write blocks into the memory based on the corresponding channel identifier of the received derandomized symbol block during a write session, and read one or more read blocks from the memory based on a specified channel identifier during one or more read sessions;

a Reed-Solomon (RS) decoder configured to receive one set of one or more RS blocks from the deinterleaver, wherein the one or more RS blocks are made up of the one or more read blocks retrieved from the SDRAM based on the specified channel identifier, correct any symbol errors therein, and generate an output including one or more decoded RS blocks, wherein upon generating the output, the RS decoder receives another set of one or more RS blocks from the deinterleaver, and wherein this other set of one or more RS blocks are made up of one or more read blocks retrieved from the SDRAM based on another specified channel identifier; and a packet synchronization circuit configured to receive one set of one or more decoded RS blocks and perform packet synchronization to identify packet boundaries within the one set of one or more decoded RS blocks;

wherein the input buffer, the TCM decoder, the frame synchronizer, the derandomizer, the deinterleaver, the RS decoder and the packet synchronization circuit are able to respectively process data corresponding to the plurality of channels in a concurrent manner.

15. The system of claim 14 wherein:

each symbol is a quadrature amplitude modulated (QAM) symbol having an I-component and a Q-component; and the predetermined number of symbols is an integer multiple of a plurality of puncture positions.

16. The system of claim 14 wherein each of the plurality of derandomized words has a word length that matches a data width of the memory.

17. The system of claim 14 wherein the packet synchronization circuit is capable of operating in one of a plurality of operating modes including a first mode, a second mode and a third mode.

18. The system of claim 14 wherein:

each symbol is a quadrature amplitude modulated (QAM) symbol having an I-component and a Q-component, and the TCM decoder includes first and second Viterbi convolutional decoders operating in a parallel manner, the first and second Viterbi convolutional decoders respectively receiving the I-component and the Q-component.

19. The system of claim 18 wherein:

the TCM decoder further includes a trellis coded modulation (TCM) synchronizer configured to identify a puncture position using the corresponding I-components and Q-components from the symbol block being processed by the first decoder; and the TCM synchronizer provides the puncture position to the first and second Viterbi convolutional decoders for Viterbi decoding.

20. The system of claim 14 wherein:

the frame synchronizer is capable of operating in one of a plurality of operating modes including a first mode, a second mode and a third mode; and the frame synchronizer selects the appropriate mode to process the TCM-decoded symbol block from the TCM decoder based on the corresponding channel identifier.

21. The system of claim 20 wherein:

when engaged in the first mode, the frame synchronizer identifies locations of frame boundaries in the TCM-decoded symbol block;

when engaged in the second mode, the frame synchronizer confirms the identified locations of frame boundaries in the TCM-decoded symbol block; and when engaged in the third mode, the frame synchronizer outputs the TCM-decoded symbol block.

22. The system of claim 20 wherein:

upon completion of processing of the TCM-decoded symbol block, the frame synchronizer stores the frame information and mode information, the mode information being associated with the channel identifier corresponding to the TCM-decoded symbol block and indicating the operating mode that is last used to process the TCM-decoded symbol block; and upon receiving a next channel identifier, the frame synchronizer selects an appropriate operating mode based on the mode information.

23. The system of claim 22 wherein the appropriate operating mode is selected as follows: if the next channel identifier is the same as a previously stored channel identifier, the operating mode associated with the previously stored channel identifier is engaged by the frame synchronizer to process the TCM-decoded symbol block associated with the next channel identifier.

* * * * *